(12) United States Patent
Minervini

(10) Patent No.: US 6,781,231 B2
(45) Date of Patent: Aug. 24, 2004

(54) MICROELECTROMECHANICAL SYSTEM PACKAGE WITH ENVIRONMENTAL AND INTERFERENCE SHIELD

(75) Inventor: Anthony D. Minervini, Palos Hills, IL (US)

(73) Assignee: Knowles Electronics LLC, Itasca, IL (US)

( * ) Notice: Subject to any disclaimer, the term of this patent is extended or adjusted under 35 U.S.C. 154(b) by 7 days.

(21) Appl. No.: 10/238,256

(22) Filed: Sep. 10, 2002

(65) Prior Publication Data

US 2004/0046245 A1 Mar. 11, 2004

(51) Int. Cl.$^7$ .............................................. H01L 23/12
(52) U.S. Cl. ...................... 257/704; 257/724; 257/730
(58) Field of Search .................................. 257/704, 723, 257/724, 728, 729, 730, 773; 438/22, 26, 48, 106, 121, 124

(56) References Cited

U.S. PATENT DOCUMENTS

| | | |
|---|---|---|
| 4,533,795 A | 8/1985 | Baumhauer, Jr. et al. |
| 4,628,740 A | 12/1986 | Ueda et al. |
| 4,776,019 A | 10/1988 | Miyatake |
| 4,825,335 A | 4/1989 | Wilner |
| 4,908,805 A | 3/1990 | Sprenkels et al. |
| 4,910,840 A | 3/1990 | Sprenkels et al. |
| 5,146,435 A | 9/1992 | Bernstein |
| 5,151,763 A | 9/1992 | Marek et al. |
| 5,178,015 A | 1/1993 | Loeppert et al. |
| 5,357,807 A * | 10/1994 | Guckel et al. ................. 73/721 |
| 5,408,731 A | 4/1995 | Berggvist et al. |
| 5,449,909 A | 9/1995 | Kaiser et al. |
| 5,452,268 A | 9/1995 | Bernstein |
| 5,490,220 A | 2/1996 | Loeppert |
| 5,506,919 A | 4/1996 | Roberts |
| 5,531,787 A | 7/1996 | Lesinski et al. |
| 5,592,391 A | 1/1997 | Muyshondt et al. |
| 5,593,926 A * | 1/1997 | Fujihira ...................... 438/114 |
| 5,740,261 A | 4/1998 | Loeppert et al. |
| 5,748,758 A | 5/1998 | Menasco, Jr. et al. |
| 5,831,262 A | 11/1998 | Greywall et al. |
| 5,870,482 A | 2/1999 | Loeppert et al. |
| 5,923,995 A * | 7/1999 | Kao et al. .................... 438/460 |
| 5,939,968 A | 8/1999 | Nguyen et al. |
| 6,012,335 A | 1/2000 | Bashir et al. |
| 6,078,245 A | 6/2000 | Fritz et al. |
| 6,108,184 A | 8/2000 | Minervini et al. |
| 6,191,928 B1 | 2/2001 | Rector et al. |
| 6,282,072 B1 | 8/2001 | Minervini et al. |
| 2002/0067663 A1 | 6/2002 | Minervini et al. |
| 2004/0032705 A1 * | 2/2004 | Ma ............................ 361/233 |

FOREIGN PATENT DOCUMENTS

| | | |
|---|---|---|
| EP | 0 077 615 A | 4/1983 |
| EP | 0 774 888 A3 | 5/1997 |
| WO | WO02-15636 A2 | 2/2002 |

\* cited by examiner

Primary Examiner—Alonzo Chambliss
(74) Attorney, Agent, or Firm—Marshall, Gerstein & Borun LLP

(57) ABSTRACT

A microelectromechanical system package has a microelectromechanical system microphone, a substrate, and a cover. The substrate has a surface for supporting the microelectromechanical microphone. The cover includes a conductive layer having a center portion bounded by a peripheral edge portion. A housing is formed by connecting the peripheral edge portion of the cover to the substrate. The center portion of the cover is spaced from the surface of the substrate to accommodate the microelectromechanical system microphone. The housing includes an acoustic port for allowing an acoustic signal to reach the microelectromechanical system microphone.

22 Claims, 2 Drawing Sheets

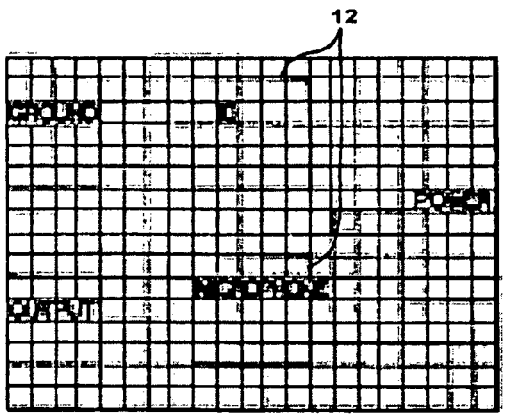
Fig. 2b
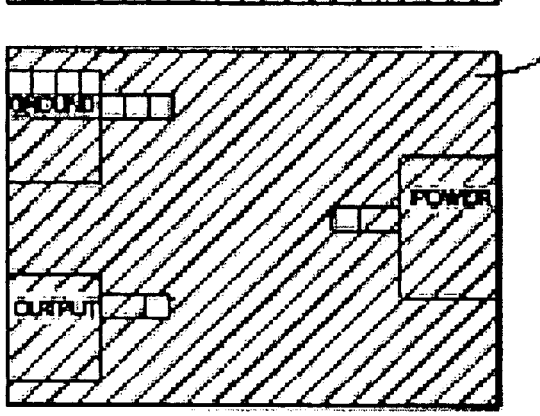
Fig. 2c
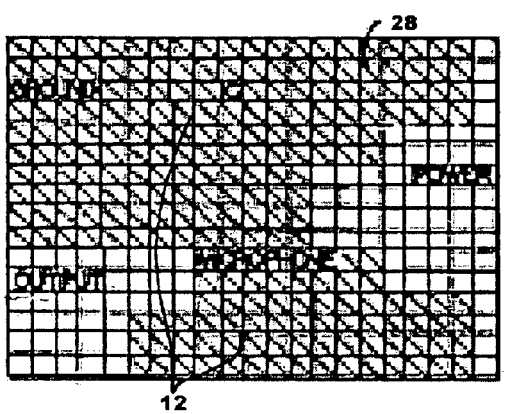
Fig. 2d
Fig. 3
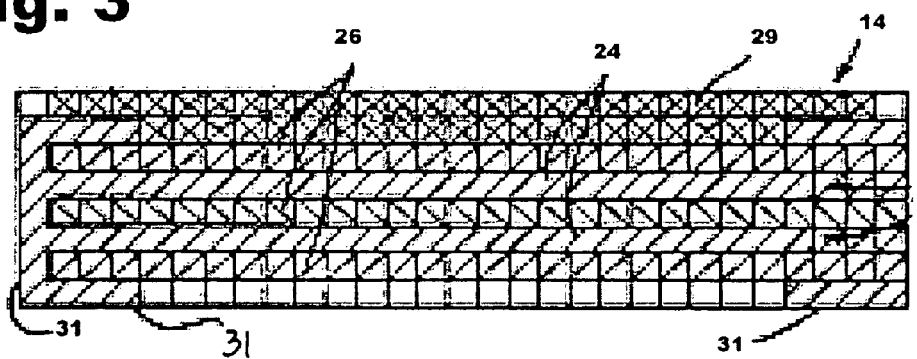

MICROELECTROMECHANICAL SYSTEM PACKAGE WITH ENVIRONMENTAL AND INTERFERENCE SHIELD

TECHNICAL FIELD

The present invention relates generally to microelectromechanical systems microphones. More particularly, this invention relates to a microelectromechanical system package for providing an environmental and interference shield to a microelectromechanical system microphone.

BACKGROUND OF THE INVENTION

There have been a number of disclosures related to building microphone elements on the surface of a silicon die. Certain of these disclosures have come in connection with the hearing aid field for the purpose of reducing the size of the hearing aid unit. While these disclosures have reduced the size of the hearing aid, they have not disclosed how to protect the transducer from outside interferences. For instance, transducers of this type are fragile and susceptible to physical damage. Furthermore, they must be protected from light and electromagnetic interferences. Moreover, they require an acoustic pressure reference to function properly. For these reasons, the silicon die must be shielded.

Some shielding practices have been used to house these devices. For instance, insulated metal cans or discs have been provided. Additionally, DIPs and small outline integrated circuit (SOIC) packages have been utilized. However, the drawbacks associated with manufacturing these housings, such as lead time, cost, and tooling, make these options undesirable.

SUMMARY OF THE INVENTION

The present invention is related to a packaging for a microelectromechanical system (MEMS) microphone. The MEMS microphone package provides a shield for a MEMS microphone from an interference signal and/or environmental condition. The package generally comprises a MEMS microphone, a substrate and a cover.

One object of the invention is to provide such a package comprising a substrate having a surface for supporting the MEMS microphone, and a cover. The cover includes a conductive layer and a center portion bounded by a peripheral edge portion. A housing is formed by connecting the peripheral edge portion of the cover to the substrate. The center portion of the cover is spaced from the surface of the substrate to accommodate the MEMS microphone. The housing includes an acoustic port for allowing an acoustic signal to reach the MEMS microphone. The housing provides protection to the MEMS microphone from an interference signal.

Another object of the invention is to provide a MEMS package comprising a silicon-based microphone, a substrate, and a cover. The substrate includes a surface at least partially covered by a first layer of a conductive material. The silicon-based microphone is electrically coupled to the layer of a conductive material. The cover comprises a second layer of a conductive material. The cover is electrically connected to the first layer of a conductive material to provide a chamber in which the silicon-based microphone is located. The chamber provides an acoustic front volume for the silicon-based microphone.

Another object of the invention is to provide a package for a MEMS microphone. The package comprises a substrate, a first layer of a conductive material, as second layer of a conductive material, and an acoustic port. The substrate is produced from a non-conductive material and includes an upper surface. The first layer of a conductive material at least partially covers the upper surface of the substrate. The second layer of a conductive material is electrically connected to the first layer of a conductive material. The second layer of a conductive material comprises a peripheral edge portion that is at least partially sealed to the substrate and a central portion spaced from the upper surface of the substrate to provide a chamber. The acoustic port allows acoustic energy to enter the chamber.

Another object of the present invention is to provide a package for MEMS microphone comprising a substrate, a first layer of a conductive material, and a cover. The substrate is produced from a non-conductive material having an upper surface. The first layer of a conductive material at least partially covers the upper surface of the substrate. The cover includes a formed metal cup electrically connected to the first layer of a conductive material. The formed metal cup comprises a peripheral edge portion at least partially sealed to the substrate and a central portion spaced from the upper surface of the substrate to provide a chamber. The acoustic port allows acoustic energy to enter the chamber.

Another object of the present invention is to provide a MEMS package comprising a MEMS microphone, a substrate, a cover, and a housing. The substrate comprises a surface for supporting the MEMS microphone. The cover has a central portion bounded by a peripheral edge, and comprises a first formed metal cup and a second metal cup fit within the first metal cup in mating relationship. The cover further comprises an environmental barrier layer disposed between the first and second metal cups. The housing is formed by connecting the peripheral edge portion of the cover to the substrate. The center portion of the cover is spaced from the surface of the substrate to accommodate the MEMS microphone. The housing includes an acoustic port for allowing an acoustic signal to reach the MEMS microphone wherein the housing provides protection from an interference signal.

Other features and advantages of the invention will be apparent from the following specification taken in conjunction with the following drawings.

BRIEF DESCRIPTION OF THE DRAWINGS

FIG. 2b is a plan view of a layer of the laminated substrate of FIG. 2a;

FIG. 2c is a plan view of a layer of the laminated substrate of FIG. 2a;

FIG. 2d is a plan view of a layer of the laminated substrate of FIG. 2a; and

FIG. 3 is a cross-sectional view of a substrate portion of a MEMS package.

DETAILED DESCRIPTION OF THE PREFERRED EMBODIMENTS

Figure 1:
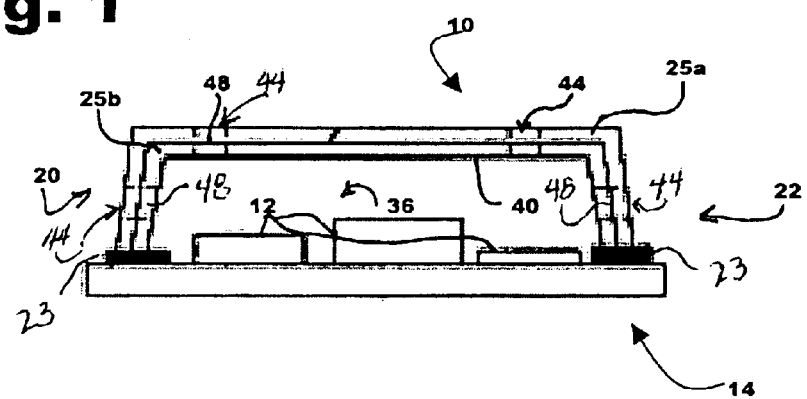
FIG. 1 is a cross-sectional view of a MEMS package of the present invention.

While this invention is susceptible of embodiments in many different forms, there are shown in the drawings and will herein be described in detail preferred embodiments of the invention with the understanding that the present disclosure is to be considered as an exemplification of the principles of the invention and is not intended to limit the broad aspect of the invention to the embodiments illustrated.

The present invention is directed to microelectromechanical system (MEMS) packages. The embodiment disclosed herein would have a better match of thermal coefficients of expansion with the end user's PCB since this part would typically be mounted of FR-4 which is the same material used by end users. The present design may also eliminate the need for wire bonding that is required in plastic body/lead frame packages. The foot print is typically smaller than that would be required for a plastic body/lead frame design since the leads are formed by plating a through-hole in a circuit board of which one half will eventually form the pathway to the solder pad. In a typical plastic body/lead frame design, a gull wing configuration would be used in which the leads widen the overall foot print.

Now referring to FIG. 1, an embodiment of a MEMS package 10 of the present invention is illustrated. The MEMS package 10 of the present invention generally comprises surface mountable components 12, a substrate 14, and a cover 20. The surface mountable components 12 include MEMS devices, e.g. a transducer, a silicon-based microphone such as the silicon condenser microphones disclosed in U.S. Pat. No. 5,870,482, integrated circuits and the like.

The combination of the substrate 14 and the cover 20 forms a housing 22 in which the surface mountable components 12 are located. A peripheral edge of the cover 20 is electrically connected to the substrate 14 by a conductive adhesive, solder, or the like 23. The electrical connection may also act as a gasket to form an acoustic seal, the conductive adhesive, solder, etc. acting as a sealant. A central portion of the cover 20, located inwardly from and bounded by the peripheral edge, is spaced from the substrate 14 to accommodate the size of the surface mountable components 12.

The substrate 14 is typically formed of FR-4 material which may be processed in circuit board panel form, thus taking advantage of economies of scale in manufacturing. The substrate 14 may be formed from layers of materials, such as those used in providing circuit boards (See FIGS. 2a and 3). Accordingly, the substrate 14 generally comprises alternating layers of conductive and non-conductive materials 24, 26. The non-conductive layers 26 are typically FR-4 board. The conductive layers 24 are typically copper.

Figure 2A:
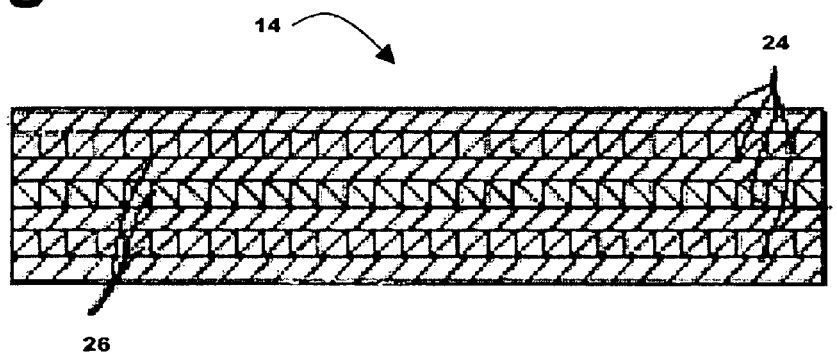
FIG. 2a is a cross-sectional view of a laminated substrate portion of a MEMS package.

Referring to FIGS. 2a through 2d, the substrate 14 comprises a laminated, multi-layered board including layers of conductive material 24 deposited on layers of non-conductive material 26. Referring to FIG. 2b, the first layer of conductive material is used to attach wire bonds or flip chip bonds. This layer includes etched portions to define lead pads, bond pads, and ground pads. The pads would have holes drilled through them to allow the formation of plated through-holes.

As shown in FIG. 2c, a dry film 27 of non-conductive material covers the conductive material. This illustration shows the exposed bonding pads as well as an exposed ground pad. The exposed ground pad would come in electrical contact with a conductive adhesive and form the connection to ground of the cover 20 and the substrate 14.

Referring to FIG. 2d, ground layers can be embedded within the substrate 14. The hatched area represents a typical ground plane 28. The ground planes 28 do not overlap the power or output pads, but may overlap the surface mountable devices 12.

Referring to FIG. 3, an embodiment of the substrate 14 is illustrated. The substrate 14 of this embodiment includes a solder mask layer 29 and alternating layers of conductive and non-conductive material 24, 26. The substrate 14 further comprises solder pads 31 for electrical connection to an end user's board.

Referring again to FIG. 1, the cover 20 is electrically connected to the substrate 14 for protection and processability. The cover 20 is produced from an outer cup 25a formed from a conductive layer of material such as copper, stainless steel, aluminum, or an alloy, such as a Cu/Ni alloy, or formed from a conductive layer plated on a ceramic, polymeric, or semiconductor material. As shown in FIG. 1, the cover 20 further includes an inner cup 25b. The inner cup 25b is also produced from a conductive layer, and likewise, can be optionally produced from a ceramic, polymeric or semiconductor material having a conductive layer deposited thereon. The inner cup 25b is somewhat smaller than the outer cup 25a so that it fits in mating relationship within the outer cup 25a.

The housing 22 includes a top portion and a bottom portion. The top portion is formed by the cover 20, and the bottom portion is formed by the substrate 14. The housing 22 forms an inner chamber 36 which is adapted for housing the surface mountable devices 12. The chamber 36 defines a front volume for a transducer when the cover 20 is acoustically sealed to the substrate 14. The chamber 36 includes an inner lining 40. The inner lining 40 is primarily formed by conductive material. It should be understood that the inner lining 40 may include portions of non-conductive material, as the conductive material may not fully cover the non-conductive material of the substrate 14. The inner lining 40 protects the surface mountable devices 12 against interference signals such as RFI signals, much like a Faraday cage.

The housing 22 also has apertures or acoustic ports 44 for receiving an acoustic signal. The acoustic ports 44 are typically located on the cover 20. The acoustic ports 44 can be located on an upper surface of the cover 20, on side surfaces of the cover 20, or in multiple locations on the upper and/or side surfaces of the cover 20. Each acoustic port 44 may contain an environmental barrier layer 48 to prevent water, particles and/or light from entering the package and damaging the internal components inside. In the embodiment illustrated in FIG. 1, the environmental barrier layer 48 is located or disposed between the outer and inner cups 25a and 25b.

The environmental barrier 48 is typically a microporous polymeric material formed to a film, such as a polytetrafluoroethylene (PTFE) or a sintered metal. The environmental barrier 48 is supplied for protecting the chamber 36 of the housing 22, and, consequently, the surface mountable devices 12 within the housing 22, from environmental elements such as sunlight, moisture, oil, dirt, and/or dust.

The environmental barrier layer 48 is generally sealed between two layers of conductive material 24, in this case the outer and inner cups 25a, 25b. When the environmental barrier layer 48 is sandwiched between two layers of conductive material 24, it may act as a capacitor (with electrodes defined by the metal) that can be used to filter input and output signals or the input power. The environmental barrier layer 48 may further serve as a dielectric protective layer when in contact with the conductive layers 24 in the event that the conductive layers 24 also contain thin film passive devices such as resistors and capacitors.

In addition to protecting the chamber 36 from environmental elements, the barrier layer 48 allows subsequent wet processing, board washing of the external portions of the housing 22, and electrical connection to ground from the walls via thru hole plating. The environmental barrier layer 48 also allows the order of manufacturing steps in the fabrication of the printed circuit board-based package to be modified. This advantage can be used to accommodate different termination styles.

While specific embodiments have been illustrated and described, numerous modifications come to mind without significantly departing from the spirit of the invention, and the scope of protection is only limited by the scope of the accompanying claims.

What is claimed is:

1. A microelectromechanical system package comprising: a microelectromechanical system microphone; a substrate comprising a surface for supporting the microelectromechanical microphone;
a cover comprising a conductive layer having a center portion bounded by a peripheral edge portion; and
a housing formed by connecting the peripheral edge portion of the cover to the substrate, the center portion of the cover spaced from the surface of the substrate to accommodate the microelectromechanical system microphone, the housing including an acoustic port for allowing an acoustic signal to reach the microelectromechanical system microphone wherein the housing provides protection from an interference signal.

2. A microelectromechanical system package for providing a shield from an interference signal, the microelectromechanical package comprising:
a silicon-based microphone;
a substrate including a surface at least partially covered by a first layer of a conductive material, the silicon-based microphone is electrically coupled to the layer of a conductive material;
a cover comprising a second layer of a conductive material, the cover electrically connected to the first layer of a conductive material and providing a chamber in which the silicon-based microphone is located, the chamber providing an acoustic front volume for the silicon-based microphone.

3. A package for a microelectromechanical system microphone, the package comprising:
a substrate of a non-conductive material having an upper surface;
a first layer of a conductive material at least partially covering the upper surface of the substrate;
a second layer of a conductive material electrically connected to the first layer of a conductive material, the second layer of a conductive material comprising a peripheral edge portion at least partially sealed to the substrate and a central portion spaced from the upper surface of the substrate to provide a chamber; and
a plurality of acoustic ports for allowing acoustic energy to enter the chamber.

4. A package for a microelectromechanical system microphone, the package comprising:
a substrate of a non-conductive material having an upper surface; a first layer of a conductive material least partially covering the upper surface of the substrate;
a cover including a formed metal cup electrically connected to the first layer of a conductive material, the formed metal cup comprising a peripheral edge portion at least partially sealed to the substrate and a central portion spaced from the upper surface of the substrate to provide a chamber; and
a plurality of acoustic ports in communication with the chamber for allowing acoustic energy to enter the housing, the acoustic ports located along a surface of the cover.

5. A microelectromechanical system package comprising:
a microelectromechanical system microphone;
a substrate comprising a surface for supporting the microelectromechanical microphone;
a cover having a central portion bounded by a peripheral edge, the cover comprising a first formed metal cup and a second metal cup fit within the first metal cup in mating relationship, the cover further comprising an environmental barrier layer disposed between the first metal cup and the second metal cup; and
a housing formed by connecting the peripheral edge portion of the cover to the substrate, the center portion of the cover spaced from the surface of the substrate to accommodate the microelectromechanical system microphone, the housing including an acoustic port for allowing an acoustic signal to reach the microelectromechanical system microphone wherein the housing provides protection from an interference signal.

6. The microelectromechanical system package of claim 5 further comprising a sealant for sealing the cover to the substrate.

7. The microelectromechanical system package of claim 6 wherein the sealant is a solder.

8. The microelectromechanical system package of claim 6 wherein the sealant is a conductive adhesive.

9. The microelectromechanical system package of claim 6 further comprising a conductive layer on the substrate.

10. The microelectromechanical system package of claim 9 wherein the sealant comprises a conductive material for providing an electrical connection between the cover and the conductive layer on the substrate.

11. The microelectromechanical system package of claim 5 further comprising an environmental barrier layer within the acoustic port.

12. The microelectromechanical system package of claim 5 wherein the cover comprises a layer of non-conductive material.

13. The microelectromechanical system package of claim 12 wherein the cover comprises alternating layers of conductive and non-conductive material.

14. The microelectromechanical system package of claim 13 wherein an outer surface of the cover comprises a conductive layer.

15. The microelectromechanical system package of claim 14 wherein an inner surface of the cover comprises a conductive layer.

16. The microelectromechanical system package of claim 5 wherein the cover further comprises a non-conductive layer having a conductive layer plated thereon.

17. The microelectromechanical system package of claim 16 wherein the cover further comprises a second non-conductive layer having a second conductive layer plated thereon.

18. The microelectromechanical system package of claim 17 wherein the cover further comprises an environmental barrier layer between the conductive layer and second conductive layer.

19. The microelectromechanical system package of claim 5 wherein the microelectromechanical system microphone is a silicon-based microphone.

20. The microelectromechanical system package of claim 5 further comprising a plurality of microelectromechanical system devices supported on the surface of the substrate.

21. The microelectromechanical system package of claim 5 wherein the cover is acoustically sealed to the substrate.

22. The microelectromechanical system package of claim 5 further comprising an integrated circuit.

* * * * *

UNITED STATES PATENT AND TRADEMARK OFFICE
CERTIFICATE OF CORRECTION

PATENT NO. : 6,781,231 B2
DATED : August 24, 2004
INVENTOR(S) : Anthony D. Minervini It is certified that error appears in the above-identified patent and that said Letters Patent is hereby corrected as shown below:

Column 5,
Line 56, please delete "material least" and insert -- material at least --.

Signed and Sealed this

First Day of February, 2005

JON W. DUDAS
*Director of the United States Patent and Trademark Office*